(12) United States Patent
Halady Subraya Bhat

(10) Patent No.: US 11,105,000 B2
(45) Date of Patent: Aug. 31, 2021

(54) ARTICLES FOR HIGH TEMPERATURE SERVICE

(71) Applicant: GENERAL ELECTRIC COMPANY, Schenectady, NY (US)

(72) Inventor: Shyamala Halady Subraya Bhat, Karnataka (IN)

(73) Assignee: General Electric Company, Schenectady, NY (US)

( * ) Notice: Subject to any disclaimer, the term of this patent is extended or adjusted under 35 U.S.C. 154(b) by 908 days.

(21) Appl. No.: 15/901,923

(22) Filed: Feb. 22, 2018

(65) Prior Publication Data

US 2020/0157692 A1 May 21, 2020

(30) Foreign Application Priority Data

Mar. 20, 2017 (IN) .............................. 201741009581

(51) Int. Cl.
| | | |
|---|---|---|
| C23C 30/00 | (2006.01) | |
| C23C 28/00 | (2006.01) | |
| C23C 14/08 | (2006.01) | |
| F01D 5/28 | (2006.01) | |
| C23C 14/30 | (2006.01) | |

(52) U.S. Cl.
CPC ........ C23C 28/3455 (2013.01); C23C 14/083 (2013.01); F01D 5/288 (2013.01); C23C 14/30 (2013.01); F05D 2230/90 (2013.01); F05D 2300/502 (2013.01)

(58) Field of Classification Search
None
See application file for complete search history.

(56) References Cited

U.S. PATENT DOCUMENTS

| | | | |
|---|---|---|---|
| 6,117,560 A * | 9/2000 | Maloney | C23C 28/3455 428/472 |
| 6,803,135 B2 | 10/2004 | Liu et al. | |
| 7,041,383 B2 | 5/2006 | Liu et al. | |
| 8,114,800 B2 * | 2/2012 | Subramanian | C23C 28/321 501/126 |
| 8,278,232 B2 | 10/2012 | Malow et al. | |
| 8,449,994 B2 * | 5/2013 | Tolpygo | C23C 28/3215 428/702 |

(Continued)

FOREIGN PATENT DOCUMENTS

| | | | | |
|---|---|---|---|---|
| CA | 2549091 A1 | 12/2005 | | |
| WO | WO-2012107130 A1 * | 8/2012 | ......... | C23C 28/3455 |

OTHER PUBLICATIONS

Wu et al., "Low-Thermal-Conductivity Rare-Earth Zirconates for Potential Thermal-Barrier-Coating Applications", Journal of the American Ceramic Society, vol. 85, Issue: 12, pp. 3031-3035, Dec. 2002 Journal.

(Continued)

*Primary Examiner* — Kayla McCaffrey
(74) *Attorney, Agent, or Firm* — Hoffman Warnick LLC

(57) ABSTRACT

An article for high temperature service is presented. The article includes a substrate and a plurality of coatings disposed on the substrate. At least one coating in the plurality of coatings includes an oxide of nominal composition $A_xB_{1-y}D_yO_z$, wherein A includes a rare-earth element, B includes tantalum or niobium, D includes zirconium or hafnium, $2 \le x \le 3$, $0 < y < 1$, and $6 \le z \le 7$.

20 Claims, 2 Drawing Sheets

(56) References Cited

U.S. PATENT DOCUMENTS

| | | | |
|---|---|---|---|
| 8,586,169 B2 | 11/2013 | Namba et al. | |
| 2004/0101699 A1 | 5/2004 | Vassen et al. | |
| 2006/0046090 A1 | 3/2006 | Spitsberg et al. | |
| 2007/0119713 A1* | 5/2007 | Hasz | C25D 7/10 204/490 |
| 2010/0242797 A1* | 9/2010 | Nagano | C23C 4/11 106/286.2 |
| 2015/0159507 A1* | 6/2015 | Sivaramakrishnan | C23C 4/134 428/596 |
| 2016/0115819 A1 | 4/2016 | Nayak et al. | |
| 2016/0168684 A1 | 6/2016 | Brosnan et al. | |

OTHER PUBLICATIONS

Cao et al., "Lanthanum-Cerium Oxide as a Thermal Barrier-Coating Material for High-Temperature Applications", Advanced Materials, vol. 15, Issue: 17, pp. 1438-1442, Sep. 1, 2003 Advanced.

Extended European Search Report and Opinion issued in connection with corresponding EP Application No. 18161341.5 dated Jun. 22, 2018.

\* cited by examiner

ARTICLES FOR HIGH TEMPERATURE SERVICE

BACKGROUND

The disclosure relates generally to coatings used in articles for high temperature service. More particularly, the disclosure relates to articles including thermal barrier coatings.

Thermal barrier coatings are typically used in articles that operate at or are exposed to high temperatures. Aviation turbines and land-based turbines, for example, may include one or more components protected by the thermal barrier coatings. Examples of materials used for thermal barrier coatings include rare earth-stabilized zirconia materials such as yttrium-stabilized zirconia (YSZ). Rare earth stabilized zirconia materials have a thermal conductivity of about 2.2 W/m-K when evaluated as a dense sintered compact. The YSZ is widely used as a TBC material in gas turbines, in part, because of its high temperature capability, low thermal conductivity, and relative ease of deposition. In recent years, there has been a growing demand for further improvements in the thermal barrier properties to decrease the overall weight, thickness, and amount of materials used to form TBCs. Thus, TBCs exhibiting lower thermal conductivity than conventionally used rare earth stabilized zirconia and having good phase stability at operating temperatures of the components are desired.

Furthermore, under normal conditions of operation, thermal-barrier coated components may be susceptible to various types of damage, including erosion, oxidation, and attack from environmental contaminants. For turbine components, environmental contaminant compositions of particular concern are those containing oxides of calcium, magnesium, aluminum, silicon, and mixtures thereof. These oxides combine to form contaminant compositions comprising mixed calcium-magnesium-aluminum-silicon-oxide systems (Ca—Mg—Al—SiO), hereafter referred to as "CMAS." At the high turbine operating temperatures, these environmental contaminants can adhere to the heated or hot thermal barrier coating surface, and thus cause damage to the thermal barrier coating. For example, CMAS can form compositions that are liquid or molten at the operating temperatures of the turbines. The molten CMAS composition can dissolve the thermal barrier coating, or can infiltrate its porous structure by infiltrating the pores, channels or other cavities in the coating. Upon cooling, the infiltrated CMAS composition solidifies and reduces the coating strain tolerance, thus initiating and propagating cracks that may cause delamination and spalling of the coating material. This may further result in partial or complete loss of the thermal protection provided to the underlying metal substrate of the part or component. Further, spallation of the thermal barrier coating may create hot spots in the metal substrate leading to premature component failure. Premature component failure can lead to unscheduled maintenance as well as parts replacement resulting in reduced performance, and increased operating and servicing costs.

Thus, there is a need for improved coating compositions that can function as thermal barrier coatings, function as CMAS-reactive protective coatings, or function both as thermal barrier coatings and as CMAS-reactive protective coatings.

BRIEF DESCRIPTION

One embodiment of the disclosure is directed to an article including a substrate and a plurality of coatings disposed on the substrate. At least one coating in the plurality of coatings includes an oxide of nominal composition $A_xB_{1-y}D_yO_z$, wherein A includes a rare-earth element, B includes tantalum or niobium, D includes zirconium or hafnium, $2 \leq x \leq 3$, $0 < y < 1$, and $6 \leq z \leq 7$.

Another embodiment of the disclosure is directed to an article including a substrate; a bond coating disposed on the substrate; and a thermal barrier coating disposed on the bond coating. The thermal barrier coating includes an oxide of nominal composition $Gd_3B_{1-y}D_yO_z$, B includes tantalum or niobium, D includes zirconium or hafnium, $0 < y < 1$, and $6.5 \leq z \leq 7$.

DRAWINGS

These and other features, aspects, and advantages of the present disclosure will become better understood when the following detailed description is read with reference to the accompanying drawings, in which like characters represent like parts throughout the drawings, wherein.

DETAILED DESCRIPTION

Figure 1:
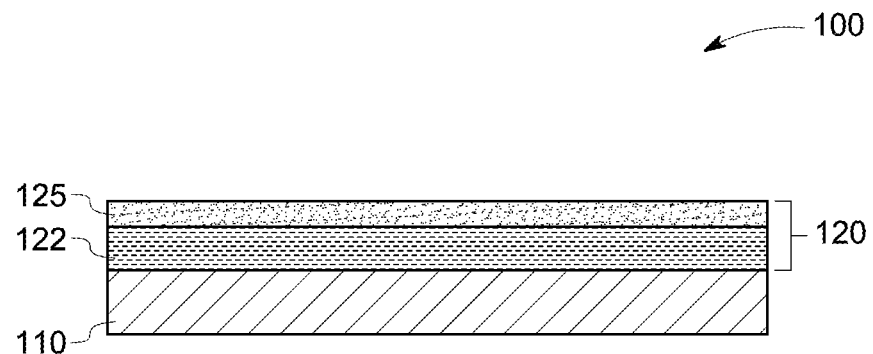
FIG. 1 illustrates a schematic of an article, in accordance with an embodiment of the disclosure.

Approximating language, as used herein throughout the specification and claims, may be applied to modify any quantitative representation that could permissibly vary without resulting in a change in the basic function to which it is related. Accordingly, a value modified by a term or terms, such as "about", and "substantially" is not to be limited to the precise value specified. In some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

In the following specification and the claims, the singular forms "a", "an" and "the" include plural referents unless the context clearly dictates otherwise. As used herein, the term "or" is not meant to be exclusive and refers to at least one of the referenced components being present and includes instances in which a combination of the referenced components may be present, unless the context clearly dictates otherwise.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances, the modified term may sometimes not be appropriate, capable, or suitable.

As used herein, the term "coating" refers to a material disposed on at least a portion of an underlying surface in a continuous or discontinuous manner. Further, the term "coating" does not necessarily mean a uniform thickness of the disposed material, and the disposed material may have a uniform or a variable thickness. The term "coating" may refer to a single layer of the coating material or may refer to a plurality of layers of the coating material. The coating material may be the same or different in the plurality of layers.

As used herein, the term "disposed on" refers to layers or coatings disposed directly in contact with each other or indirectly by having intervening layers there between, unless otherwise specifically indicated. The term "depositing on" refers to a method of laying down material in contact with an underlying or adjacent surface in a continuous or discontinuous manner. The term "adjacent" as used herein means that the two materials or coatings are disposed contiguously and are in direct contact with each other.

Some embodiments present an article including a substrate and a plurality of coatings disposed on the substrate. At least one coating in the plurality of coatings includes an oxide of nominal composition $A_xB_{1-y}D_yO_z$, wherein A includes a rare-earth element, B includes tantalum or niobium, D includes zirconium or hafnium, $2 \leq x \leq 3$, $0 < y < 1$, and $6 \leq z \leq 7$. The terms "oxide of nominal composition $A_xB_{1-y}D_yO_z$" and "oxide" are used herein interchangeably throughout the text.

The term "nominal $A_xB_{1-y}D_yO_z$ composition" as used herein means that some substitution of different elements at the crystal lattice sites occupied by the elements A, B, D and O are encompassed by the composition as described. For example, some amount of fluorine, nitrogen, or other suitable anion may be substituted for the oxygen at the crystal site occupied by O, and the resulting material is considered to be within the scope of the nominal composition, so long as the resultant material retains the property desired by the resulting composition (e.g., low thermal conductivity or reactivity with CMAS-type materials). Similarly, some amount of metal (e.g., alkaline earth element) may be substituted for the rare-earth element at the crystal site occupied by the rare-earth element, and the resulting material is considered to be within the scope of the nominal composition, so long as the resultant material retains the property desired by the resulting composition (e.g., low thermal conductivity or reactivity with CMAS-type materials).

Those skilled in the art will appreciate that substitution of various elements within the $A_xB_{1-y}D_yO_z$ structure, such as those noted above, may be suitable so long as certain constraints such as charge compensation and lattice geometrical considerations can be met to maintain the crystal structure. For instance, where substitution of one or more cation sites (or filling one or more vacant sites) would result in a charge imbalance in the stoichiometric $A_xB_{1-y}D_yO_z$, the composition of the oxide may shift to include slightly less or more oxygen to compensate for the apparent imbalance.

As used herein, the term "rare earth element" encompasses elements of the lanthanide series, yttrium, and scandium. In some embodiments, A in $A_xB_{1-y}D_yO_z$ includes lanthanum, yttrium, ytterbium, cerium, gadolinium, or combinations thereof. In certain embodiments, A in $A_xB_{1-y}D_yO_z$ includes gadolinium. Further, in some embodiments, B in $A_xB_{1-y}D_yO_z$ includes tantalum. In some such instances, the oxide may have a nominal composition $Gd_xTa_{1-y}D_yO_z$. In certain embodiments, D in $A_xB_{1-y}D_yO_z$ includes zirconium. In some such embodiments, the oxide may have a nominal composition $Gd_xB_{1-y}Zr_yO_z$. Further, in some such embodiments, the oxide may have a nominal composition $Gd_xTa_{1-y}Zr_yO_z$.

As noted previously y is a number greater than 0 and less than 1. In some embodiments, $0.1 \leq y \leq 0.9$. In some embodiments, $0.25 \leq y \leq 0.75$. In some embodiments, $0.1 \leq y \leq 0.5$. In some embodiments, $0.5 \leq y \leq 1$. In some embodiments y is about 0.5. In some such instances, the oxide may have a nominal composition $A_xB_{0.5}D_{0.5}O_z$. Further, in some embodiments, x is a number equal to or greater than 2 and less than or equal to 3. In some embodiments, $2.1 \leq x \leq 2.9$. In some embodiments, $2.2 \leq x \leq 2.8$. In some embodiments, x is about 3. In such instances, the oxide is of nominal composition $A_3B_{1-y}D_yO_z$, wherein A includes a rare element, B includes tantalum or niobium, D includes zirconium or hafnium, $0 < y < 1$, and $6 \leq z \leq 7$.

Furthermore, in some embodiments, z is a number equal to or greater than 6 and less than or equal to 7. In some embodiments, $6.5 \leq z \leq 6.9$. As will be appreciated by one of ordinary skill in the art, the value of "z" will be determined by the stoichiometry of the corresponding oxides used to form the oxide.

In some embodiments, the oxide is of nominal composition $Gd_3Ta_{1-y}D_yO_z$, wherein D is zirconium or hafnium, $0 < y < 1$, and $6.5 \leq z \leq 6.99$. In some embodiments, the oxide is of nominal composition $Gd_3Ta_{1-y}D_yO_z$, wherein D is zirconium or hafnium, $0.1 \leq y \leq 0.5$, and $6.75 \leq z \leq 6.95$. In some embodiments, the oxide is of nominal composition $Gd_3Ta_{1-y}D_yO_z$, wherein D is zirconium or hafnium, $0.5 \leq y \leq 0.9$, and $6.55 \leq z \leq 6.75$. In some embodiments, the oxide has a nominal composition $Gd_3Ta_{1-y}Zr_yO_z$, $0.1 \leq y \leq 0.5$ and $6.75 \leq z \leq 6.95$. In certain embodiments, the oxide is of nominal composition $Gd_3Ta_{0.5}Zr_{0.5}O_{6.75}$. Inventors of the present disclosure have found that substitution of a 4+ valency element (e.g., Zr) for a 5+valency element (e.g., Ta) resulted in a stable, single-phase compound, even at substitution levels up to y=0.5.

FIG. 1 illustrates an article 100 in accordance with an embodiment of the disclosure. As illustrated in FIG. 1, the article 100 includes a plurality of coatings 120 disposed on a substrate 110. As mentioned previously, at least one coating in the plurality of coatings 120 includes the oxide of nominal composition $A_xB_{1-y}D_yO_z$. In some embodiments, the coating 122 in the plurality of coatings 120 is a thermal barrier coating (TBC), which includes the oxide. As used herein, the term "thermal barrier coating" refers to a coating that includes a material capable of reducing heat flow to the underlying substrate of the article, that is, form a thermal barrier.

In some embodiments, the thermal barrier coating may consist essentially of the oxide. The term "consist essentially" as used in this context means that the thermal barrier coating is comprised of at least 95 wt % of the oxide. In some embodiments, the thermal barrier coating may include the oxide in an amount of up to 100 wt %. In some embodiments, the thermal barrier coating includes the oxide in an amount in a range from about 95 wt % to about 100 wt %; more particularly from about 98 wt % to about 100 wt %.

In some embodiments, the thermal barrier coating may include the oxide in an amount in a range from about 50 wt % to about 90 wt %. In some such embodiments, the thermal barrier coating may include the oxide and additional ceramic thermal barrier coating materials. Non-limiting examples of additional ceramic thermal barrier coating materials include zirconias, pyrochlores, or combinations thereof. In some embodiments, the additional ceramic thermal barrier material includes chemically stabilized zirconias (for example, oxides blended with zirconia), such as yttria-stabilized zirconias, ceria-stabilized zirconias, calcia-stabilized zirconias, scandia-stabilized zirconias, magnesia-stabilized zirconias, india-stabilized zirconias, ytterbia-stabilized zirconias, lanthana-stabilized zirconias, gadolinia-stabilized zirconias, as well as mixtures of such stabilized zirconias.

In certain embodiments, the additional ceramic thermal barrier coating material includes yttria-stabilized zirconias. Suitable yttria-stabilized zirconias may include from about 1 wt % to about 20 wt % yttria (based on the combined weight of yttria and zirconia), and more typically from about 3 wt % to about 10 wt % yttria. An example yttria-stabilized zirconia thermal barrier coating includes about 7 wt % yttria and about 93 wt % zirconia. These chemically stabilized zirconias may further include one or more of a second metal (e.g., a lanthanide or actinide) oxide such as dysprosia, erbia, europia, gadolinia, neodymia, praseodymia, urania, and hafnia to further reduce thermal conductivity of the thermal barrier coating. In some embodiments, the thermal barrier coating may further include an additional metal oxide, such as, titania.

In some embodiments, suitable ceramic thermal barrier coating materials may include pyrochlores of general formula $A_2B_2O_7$ where A is a metal having a valence of 3+ or 2+ (e.g., gadolinium, aluminum, cerium, lanthanum or yttrium) and B is a metal having a valence of 4+ or 5+ (e.g., hafnium, titanium, cerium or zirconium) where the sum of the A and B valences is 7. Representative materials of this type include gadolinium zirconate, lanthanum titanate, lanthanum zirconate, yttrium zirconate, lanthanum hafnate, cerium zirconate, aluminum cerate, cerium hafnate, aluminum hafnate, and lanthanum cerate.

The composition of the thermal barrier coating in terms of the type and amount of the ceramic thermal barrier coating materials may depend upon one or more factors, including the composition of the adjacent bond coat layer (if present), the coefficient of thermal expansion (CTE) characteristics desired for the thermal barrier coating, and the thermal barrier properties desired for the thermal barrier coating.

In some embodiments, the oxide composition may be constant across a certain thickness of the thermal barrier coating. In such instances, the oxide may form a layer and the additional ceramic layer may form another layer in the thermal barrier coating. In some other embodiments, a composition of oxide may be graded across a thickness of the thermal barrier coating.

The thickness of the thermal barrier coating may depend upon the substrate or the component it is deposited on. In some embodiments, the thermal barrier coating has a thickness in a range from about 30% to about 90% of the total thickness of the plurality of coatings. In some embodiments, the thermal barrier coating has a thickness in a range from about 25 microns to about 2000 microns. In some embodiments, the thermal barrier coating has a thickness in a range of from about 25 microns to about 1500 microns. In some embodiments, the thermal barrier coating has a thickness in a range of from about 25 microns to about 1000 microns.

Referring again to FIG. 1, in some embodiments, the coating 125 in the plurality of coatings 120 may include a top-coat, a protective coating, or a combination thereof. In some embodiments, the coating 125 in the plurality of coatings may include a CMAS-reactive protective coating, an environmental barrier coating, or an erosion resistant layer.

Figure 2:
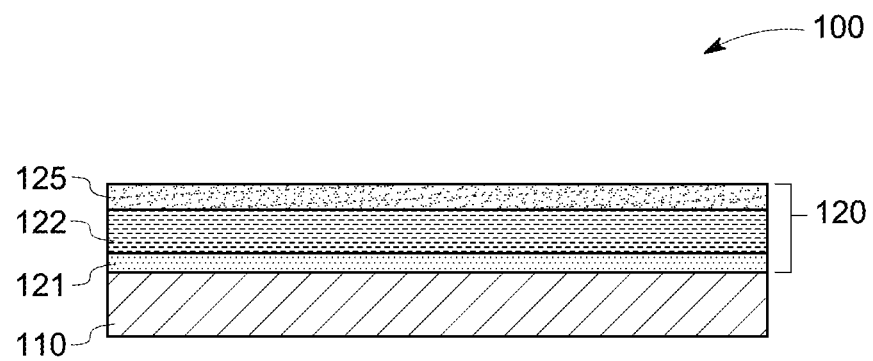
FIG. 2 illustrates a schematic of an article, in accordance with an embodiment of the disclosure.

In some embodiments, the article may further include a bond coating disposed between the substrate and the thermal barrier coating. FIG. 2 illustrates an embodiment wherein the article 100 includes a bond coating 121. In the embodiment illustrated in FIG. 2, the plurality of coatings 120 includes a bond coating 121, a thermal barrier coating 122, and a protective coating or top-coat 125, wherein the thermal barrier coating 122 includes the oxide. The bond coating may be formed from a metallic oxidation-resistant material that protects the underlying substrate and enables the thermal barrier coating to more tenaciously adhere to substrate. Suitable materials for the bond coating include $M_1CrAlY$ alloy powders, where $M_1$ represents a metal such as iron, nickel, platinum or cobalt. Non-limiting examples of suitable bond coat materials include metal aluminides such as nickel aluminide, platinum aluminide, or combinations thereof. The bond coating may have a thickness in the range of from about 25 microns to about 500 microns.

In some embodiments, an article including a substrate, a bond coating disposed on the substrate, and a thermal barrier coating disposed on the bond coating, is presented. The thermal barrier coating includes an oxide of nominal composition $Gd_3B_{1-y}D_yO_z$, wherein B includes tantalum or niobium, D includes zirconium or hafnium, $0<y<1$, and $6.5 \leq z \leq 6.99$. In some such embodiments, B includes tantalum and the oxide has nominal composition $Gd_3Ta_{1-y}D_yO_z$. In some embodiments, D includes zirconium and the oxide has nominal composition $Gd_3B_{1-y}Zr_yO_z$. In some embodiments, the oxide has a nominal composition $Gd_3Ta_{1-y}Zr_yO_z$, wherein $0.1 \leq y \leq 0.5$, and $6.75 \leq z \leq 6.95$.

In some embodiments, the thermal conductivity of the oxide of nominal composition $A_xB_{1-y}D_yO_z$ is less than 1.8 W/m-K at 1000° C. In some embodiments, the thermal conductivity of the oxide of nominal composition $A_xB_{1-y}D_yO_z$ is in a range from about 1 W/m-K to about 1.6 W/m-K at 1000° C. In some embodiments, the thermal conductivity of the oxide of nominal composition $A_xB_{1-y}D_yO_z$ is in a range from about 1 W/m-K to about 1.4 W/m-K at 1000° C. In some embodiments, the thermal conductivity of the oxide of nominal composition $Gd_3Ta_{1-y}Zr_yO_z$ is in a range from about 1 W/m-K to about 1.6 W/m-K at 1000° C., wherein $0.1 \leq y \leq 0.5$ and $6.75 \leq z < 6.95$.

As mentioned earlier, in some embodiments the oxide may be capable of functioning as a CMAS-reactive material. In some such embodiments, the oxide may be disposed as a thermal barrier coating (e.g., as shown in FIGS. 1 and 2) and may function both as a thermal barrier coating material and as a CMAS-reactive material. In such embodiments, a separate CMAS-reactive protective coating may not be required in the article. In some other embodiments, the oxide is present as a CMAS-reactive material in the article along with an additional thermal barrier material. In such instances, the plurality of coatings includes a thermal barrier coating and a CMAS-reactive material including the oxide of nominal composition $A_xB_{1-y}D_yO_z$. In accordance with some embodiments of the disclosure, the CMAS-reactive material protects the thermal barrier coating by undergoing one or both of chemical and physical changes when in contact with a CMAS composition.

The term "CMAS" or "CMAS composition" as used herein refers to a contaminant composition including calcium, magnesium, aluminum and silicon. In some embodiments, other elements, such as nickel, iron, titanium and chromium, may also be present in the CMAS composition. In such instances, the additional elements may be present in a small amount, for example, less than about 10 weight percent of total amount of CMAS composition present. The particular compositional characteristics of the CMAS composition may depend on the source of the environmental contaminants and the reaction temperature. Sources of CMAS composition include, but are not limited to, sand, dirt, volcanic ash, fly ash, cement, runway dirt, fuel and air sources, oxidation and wear products from engine components, or combinations thereof.

As used herein, the term "CMAS-reactive material" refers to a material capable of reacting with a CMAS composition to form a reaction product having one or both of melting temperature and viscosity greater than that of the CMAS composition. In some instances, the reaction product may form a glassy (typically thin) protective product that the CMAS deposits are either unable to adhere to, or are less able to adhere to.

In some embodiments, the CMAS-reactive material (oxide of nominal composition $A_xB_{1-y}O_z$) may be disposed as a protective overlay coating on the thermal barrier coating. In certain embodiments, the overlay CMAS-reactive material is disposed adjacent to the thermal barrier coating. In some embodiments, the CMAS-reactive material is disposed as the outermost layer (sometimes also referred to as "top coat layer") in the article. In some other embodiments, the article may further include one or more additional layers disposed on the protective coating to form the top coat layer. Non-limiting examples of suitable top-coat layers include erosion resistant layers.

Figure 3:
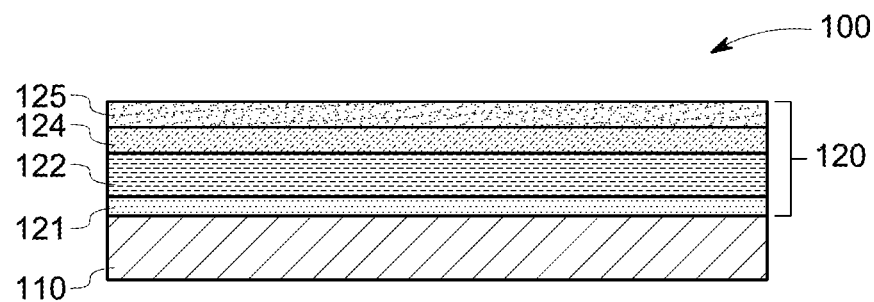
FIG. 3 illustrates a schematic of an article, in accordance with an embodiment of the disclosure.

FIG. 3 illustrates an article 100 including a substrate 110 and a plurality of coatings 120 disposed on the substrate 110. The plurality of coatings 120 includes a thermal barrier coating 122 disposed on the substrate 110, and a protective overlaying layer 124 disposed on the thermal barrier coating 122. The protective overlaying layer 124 includes the oxide in such embodiments. In the embodiment illustrated in FIG. 3, the protective overlaying layer 124 overlies and is disposed adjacent to the thermal barrier coating. The plurality of coatings 120 may further optionally include a bond coating 121 disposed between the substrate 110 and the thermal barrier coating 122 or a top coat layer 125 disposed on the protective overlying coating 124. In such instances, the thermal barrier coating 122 may include any suitable ceramic thermal barrier material as described earlier. In some such instances, the thermal barrier coating 122 may include a combination of the oxide and a ceramic thermal barrier material.

As noted earlier, the thermal barrier coatings typically include pores, channels, voids, or other cavities that may be infiltrated by molten environmental contaminants, such as, CMAS. Certain embodiments include thermal barrier coatings having surface-connected pores that incorporate the oxide of nominal composition such that the CMAS-reactive material (oxide of nominal composition $A_xB_{1-y}O_z$) is disposed within a plurality of the surface-connected pores. In some embodiments, the oxide may be disposed within the plurality of surface-connected pores of the thermal barrier coating and also as a protective overlaying coating disposed on the thermal barrier coating.

As used herein, the term "surface-connected pore" refers to a pore that is open to the surface. The surface connected pore may be a single pore or a combination of a plurality of pores, wherein the pores are interconnected and eventually connected to the surface through one or more openings to the surface. Further, the "surface" as used herein in the context of "surface-connected pore" is the top surface of the referred layer. For example, a surface connected pore of a thermal barrier coating is the pore that is open to the top surface of the thermal barrier coating, regardless of presence or absence of a protective layer on top of the thermal barrier coating.

In some instances, the pores, channels, voids, or other cavities in the thermal barrier coating surface may result due to the deposition processes. For example, thermal barrier coatings that are deposited by (air) plasma spray techniques may result in a sponge-like porous structure of open pores in at least the surface of the coating. Similarly, thermal barrier coatings that are deposited by physical vapor deposition techniques, such as, for example, electron beam physical vapor deposition (EBPVD) may result in a porous structure including a series of columnar grooves, crevices or channels in at least the surface of the coating.

In certain embodiments, at least a portion of the surface-connected pores of the thermal barrier coating includes a plurality of elongated surface-connected voids. Electron beam physical vapor deposition (EBPVD) is a typical example of a process used for deposition of thermal barrier coating, which may result in the formation of elongated surface-connected voids. As used herein, the term "elongated surface-connected void" refers to a void that has an aspect ratio higher than 1, and is often oriented such that contaminants entering the void can be conducted into the cross-sectional thickness of the thermal barrier coating. In some embodiments, elongated surface-connected voids include substantially vertically oriented (from the perspective of a cross-sectional view) cracks, grain boundaries, or other microstructural features. In some embodiments, an oxide of nominal composition $A_xB_{1-y}O_z$ is disposed within at least some voids of the plurality of the elongated surface-connected voids.

Figure 4:
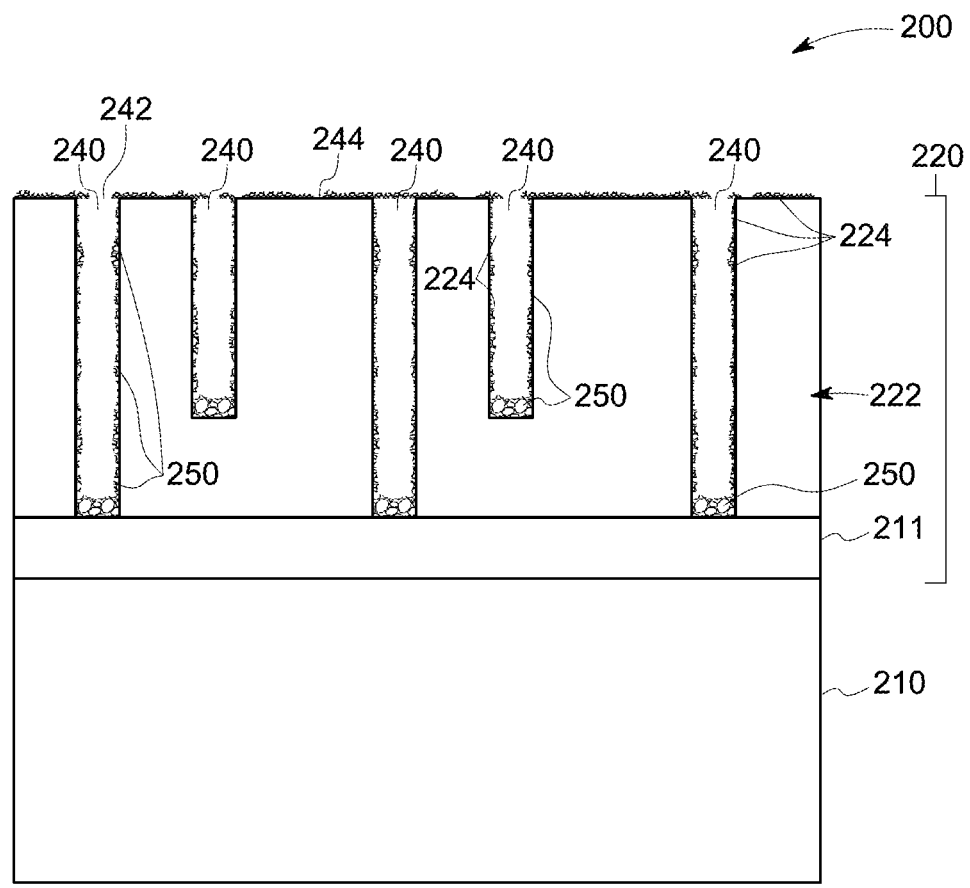
FIG. 4 illustrates a schematic of an article, in accordance with an embodiment of the disclosure.

FIG. 4 illustrates an article 200 in accordance with some embodiments of the present disclosure. Article 200 includes plurality of coatings 220 disposed on a substrate 210. The plurality of coatings 220 includes a thermal barrier coating 222 that has surface connected pores, such as, for example, elongated surface-connected voids 240 that allow access for environmental contaminants to the interior of thermal barrier coating 222. The plurality of coatings further includes a bond layer 211 disposed between the thermal barrier coating 222 and the substrate 210. In some embodiments, a CMAS-reactive material (oxide of nominal composition $A_xB_{1-y}D_yO_z$) 224 is disposed within at least some of the voids 240 of the thermal barrier coating 222. In certain embodiments, the CMAS-reactive material 224 is further disposed on the top of the thermal barrier coating 222, as shown in FIG. 4. The CMAS-reactive material 224 that is disposed on the top of the thermal barrier coating 222 may be a continuous layer, or may have pores that are connected (as shown by 242) to the surface connected voids 240 or disconnected (as shown by 244) from the surface-connected voids 240. In some embodiments, such as the illustrative embodiment shown in FIG. 4, CMAS-reactive material 224 decorates the surface of voids 240 in a discrete arrangement. In certain embodiments, the CMAS-reactive material 224 forms a continuous or substantially continuous structure within the voids 240.

In some embodiments, a barrier material 250 is optionally disposed within the voids 240, as illustrated in FIG. 4. Barrier material 250 substantially prevents chemical interaction between CMAS-reactive material 224 and a TGO disposed on substrate 210 or, if present, bond coating 211. In some embodiments, barrier material 250 includes aluminum oxide, cerium oxide, yttrium oxide, zirconium oxide, hafnium oxide, tantalum oxide, niobium oxide, titanium oxide, or combinations thereof.

In some embodiments, the oxide is present in the plurality of coatings in an amount in a range from about 0.5 volume percent to about 75 volume percent. In some embodiments, the oxide is present in the plurality of coatings in an amount in a range from about 10 volume percent to about 50 volume percent. In some embodiments, the oxide is present in the plurality of coatings in an amount in a range from about 10 volume percent to about 25 volume percent.

The coatings of the present disclosure may be useful in a wide variety of turbine components (e.g., turbine engine components) that are operated at, or exposed to, high temperatures. In some embodiments, a turbine engine component is also presented. Non-limiting examples of suitable turbine engine components include turbine airfoils such as blades and vanes, turbine shrouds, turbine nozzles, buckets, combustor components such as liners and deflectors, heat shields, augmentor hardware of gas turbine engines, and the like. The plurality of coatings may be disposed over a portion or over all of the metal substrate. For example, with regard to airfoils such as blades, the plurality of coatings is typically used to protect, cover or overlay portions of the metal substrate of the airfoil other than solely the tip thereof, for example, the thermal barrier coatings cover the leading and trailing edges and other surfaces of the airfoil.

In some embodiments, a method of manufacturing an article is presented. In some embodiments, the method includes disposing an oxide on a substrate as a thermal barrier coating. In some embodiments, the method includes disposing a thermal barrier coating and disposing an oxide on the thermal barrier coating as a CMAS-reactive material.

The thermal barrier coating (as illustrated in FIGS. 1 and 2) may be disposed or otherwise formed on a bond coating (if present) or on the substrate directly by any of a variety of conventional techniques, including vapor disposition, such as physical vapor deposition (PVD), electron beam physical vapor deposition (EBPVD); plasma spray, such as air plasma spray (APS), suspension plasma spray (SPS), and vacuum plasma spray (VPS); other thermal spray deposition methods such as high velocity oxy-fuel (HVOF) spray, detonation, or wire spray; chemical vapor deposition (CVD), sol-gel method, or combinations of two or more of the afore-mentioned techniques The particular technique used for disposing, depositing or otherwise forming the thermal barrier coating may depend on one or more of the composition of the thermal barrier coating, the thickness, and the physical structure desired for the thermal barrier coating. In certain embodiments, the thermal barrier coating is disposed on the substrate using plasma spray techniques. Various types of plasma-spray techniques are well known to those skilled in the art, and may be utilized to dispose the thermal barrier coatings of the present disclosure.

In embodiments, wherein the thermal barrier coating further includes a ceramic thermal barrier material, the oxide and the ceramic thermal barrier material may be co-deposited on the substrate or the bond coating (if present). In some embodiments, co-depositing may be achieved by blending, mixing or otherwise combining the oxide and the ceramic thermal barrier coating material together (for example, as powders) to provide a mixture that is then deposited onto substrate/bond coating. In some embodiments, co-depositing may be achieved by separately depositing onto the substrate/bond coating (e.g., as separate plasma spray streams) the respective CMAS-reactive material and ceramic thermal barrier coating material in a manner such that these materials blend, mix or otherwise combine together to form a mixture.

In some embodiments, the thermal barrier coating may be disposed on the bond coating. In such instances, the bond coating may be applied, deposited or otherwise formed on the substrate by any of a variety of conventional techniques including, vapor disposition, such as physical vapor deposition (PVD), electron beam physical vapor deposition (EBPVD); plasma spray, such as air plasma spray (APS) and vacuum plasma spray (VPS); other thermal spray deposition methods such as high velocity oxy-fuel (HVOF) spray, detonation, or wire spray; chemical vapor deposition (CVD), sol-gel method, or combinations of two or more of the afore-mentioned techniques. In some embodiments, a plasma spray technique, such as that used for the thermal barrier coating, may be employed to dispose the bond coating on the substrate.

In some embodiments, the method of forming an article (as illustrated in FIG. 3) includes disposing the oxide as a protective overlaying layer on the thermal barrier coating. In embodiments, wherein the protective overlaying layer is primarily comprised of the oxide, the oxide be applied, deposited or formed on the thermal barrier coating using one or more of the afore-mentioned techniques used to dispose the thermal barrier coating.

A method for making articles (as illustrated in FIG. 4) may include disposing the oxide within surface connected pores/voids of a thermal barrier coating. The oxide may be disposed within the pores as a liquid or vapor infiltrant. The method may further include infiltrating the pores/voids of a thermal barrier coating with a barrier material. Techniques and methods suitable for infiltrating the pores/voids of the thermal barrier coating are described in U.S. patent application publication 2016/0168684, which is incorporated herein by reference.

According to some embodiments of the disclosure, the oxide compositions as disclosed herein may provide the desired thermal conductivity and may be cost-effective as thermal barrier coating materials. Further, according to some embodiments of the disclosure, the oxide compositions as disclosed herein may provide thermal barrier coatings with at least partial and up to complete protection and mitigation against the adverse effects of environmental contaminant compositions that can deposit on the surface of such coatings during normal turbine operation.

EXAMPLES

An oxide composition $Gd_3Ta_{0.5}Zr_{0.5}O_{6.75}$ was synthesized by contacting the corresponding oxides in the stoichiometric amounts. Inventors of the present disclosure have found that substitution of a 4+valency element (e.g., Zr) for a 5+valency element (e.g., Ta) resulted in a stable, single-phase compound, even at substitution levels up to y=0.5. This was evidenced by the scanning electron microscopy (SEM) micrographs of the resulting composition Table 1 illustrates the thermal conductivity data (at about 58 K LMP (Larsen Miller Parameter)) for pellets of an oxide in accordance with some embodiments of the disclosure at 900° C. and at 1100° C. Thermal conductivity data of 8YSZ, 20YSZ and $Gd_3TaO_7$ samples are also provided for comparison.

TABLE 1

Thermal Conductivity (TC) data of rare earth zirconates, $Gd_3TaO_7$ and $Gd_3Ta_{0.5}Zr_{0.5}O_{6.75}$

| Formula | TC at 900° C. (W/m-K) | TC at 1100° C. (W/m-K) |
|---|---|---|
| $Y_{8.67}Zr_{91.33}O_{195.65}$ (8YSZ) | 2.15 | NA |
| $Y_{21.44}Zr_{78.56}O_{189.28}$ (20YSZ) | 1.89 | 1.88 |
| $Gd_3TaO_7$ | 1.34 | 1.26 |
| $Gd_3Ta_{0.5}Zr_{0.5}O_{6.75}$ | 1.36 | 1.34 |

It was observed that the thermal conductivities of $Gd_3Ta_{0.5}Zr_{0.5}O_{6.75}$ are significantly lower than the thermal conductivities of 8YSZ and 20YSZ. Further, thermal conductivities of $Gd_3Ta_{0.5}Zr_{0.5}O_{6.75}$ were comparable to that of $Gd_3TaO_7$. However, substituting Zr for Ta in $Gd_3TaO_7$ may provide for most cost-effective thermal barrier coatings.

The foregoing examples are merely illustrative, serving to exemplify only some of the features of the invention. The appended claims are intended to claim the invention as broadly as it has been conceived and the examples herein presented are illustrative of selected embodiments from a manifold of all possible embodiments. Accordingly, it is the Applicants' intention that the appended claims are not to be limited by the choice of examples utilized to illustrate features of the present invention. As used in the claims, the word "comprises" and its grammatical variants logically also subtend and include phrases of varying and differing extent such as for example, but not limited thereto, "consisting essentially of" and "consisting of." Where necessary, ranges have been supplied; those ranges are inclusive of all sub-ranges there between. It is to be expected that variations in these ranges will suggest themselves to a practitioner having ordinary skill in the art and where not already dedicated to the public, those variations should where possible be construed to be covered by the appended claims. It is also anticipated that advances in science and technology will make equivalents and substitutions possible that are not now contemplated by reason of the imprecision of language and these variations should also be construed where possible to be covered by the appended claims.

The invention claimed is:

1. An article, comprising:
a substrate; and
a plurality of coatings disposed on the substrate, wherein at least one coating in the plurality of coatings includes an oxide of nominal composition $A_xB_{1-y}D_yO_z$, wherein A comprises a rare-earth element, B comprises tantalum or niobium, D comprises zirconium or hafnium, $2 \leq x \leq 3$, $0.1 \leq y \leq 0.5$, and $6 \leq z \leq 7$.

2. The article of claim 1, wherein B comprises tantalum.

3. The article of claim 1, wherein D comprises zirconium.

4. The article of claim 1, wherein A comprises lanthanum, yttrium, cerium, gadolinium, ytterbium, or combinations thereof.

5. The article of claim 1, wherein the oxide is of nominal composition $A_3B_{1-y}D_yO_z$.

6. The article of claim 1, wherein the oxide is of nominal composition $Gd_3Ta_{1-y}Zr_yO_z$, $0.1 \leq y \leq 0.5$ and $6.5 \leq z \leq 7$.

7. The article of claim 1, wherein a concentration of the oxide is graded across a thickness of the thermal barrier coating.

8. The article of claim 1, wherein the plurality of coatings comprises a thermal barrier coating and a calcium-magnesium-aluminum-silicon-oxide (CMAS)-reactive material comprising the oxide.

9. The article of claim 8, wherein the CMAS-reactive material is disposed as a protective overlay coating on the thermal barrier coating.

10. The article of claim 8, wherein the thermal barrier coating comprises surface-connected pores, and the CMAS-reactive material is disposed within a plurality of the surface-connected pores.

11. The article of claim 10, wherein at least a portion of the surface-connected pores comprises a plurality of elongated surface-connected voids, and the CMAS-reactive material is disposed within the plurality of the elongated surface-connected voids.

12. The article of claim 8, wherein the thermal barrier coating comprises yttrium-stabilized zirconia.

13. A turbine engine component comprising the article of claim 1.

14. The turbine engine component of claim 13, wherein the article is a combustor component, a turbine blade, a shroud, a nozzle, a heat shield, or a vane.

15. The article of claim 1, wherein the at least one coating including the oxide is a thermal barrier coating, and wherein the oxide is included in the thermal barrier coating in an amount in a range from 50 wt % to 90 wt %.

16. The article of claim 1, wherein the thermal barrier coating has a thickness in a range from about 30% to about 90% of a total thickness of the plurality of coatings.

17. An article, comprising:
a substrate;
a bond coating disposed on the substrate; and
a thermal barrier coating disposed on the bond coating, wherein the thermal barrier coating comprises an oxide of nominal composition $Gd_3B_{1-y}D_yO_z$, B comprises tantalum or niobium, D comprises zirconium or hafnium, $0.1 \leq y \leq 0.5$, and $6.5 \leq z \leq 7$.

18. The article of claim 17, wherein B comprises tantalum and D comprises zirconium.

19. The article of claim 17, wherein the oxide has a nominal composition $Gd_3Ta_{1-y}Zr_yO_z$, $0.1 \leq y \leq 0.5$ and $6.75 \leq z \leq 6.95$.

20. An article, comprising:
a substrate;
a bond coating disposed on the substrate; and
a thermal barrier coating disposed on the bond coating, wherein the thermal barrier coating comprises an oxide of nominal composition wherein the oxide has a nominal composition $Gd_3Ta_{0.5}Zr_{0.5}O_{6.75}$.

* * * * *